(12) United States Patent
Kawanami et al.

(10) Patent No.: US 6,583,426 B1
(45) Date of Patent: Jun. 24, 2003

(54) PROJECTION ION BEAM MACHINING APPARATUS

(75) Inventors: Yoshimi Kawanami, Kokubunji (JP); Kaoru Umemura, Musashino (JP); Yuuichi Madokoro, Hitachinaka (JP); Satoshi Tomimatsu, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/508,265

(22) PCT Filed: Sep. 10, 1997

(86) PCT No.: PCT/JP97/03191
§ 371 (c)(1),
(2), (4) Date: May 22, 2000

(87) PCT Pub. No.: WO99/13500
PCT Pub. Date: Mar. 18, 1999

(51) Int. Cl.$^7$ .............................. G21K 5/10; H01J 37/08
(52) U.S. Cl. ............................................. 250/492.21
(58) Field of Search ................. 250/396 ML, 492.2, 250/309, 492.1

(56) References Cited

U.S. PATENT DOCUMENTS

| | | | | |
|---|---|---|---|---|
| 4,426,582 A | * | 1/1984 | Orloff et al. | 250/281 |
| 4,556,798 A | * | 12/1985 | McKenna et al. | 250/396 R |
| 4,563,587 A | * | 1/1986 | Ward et al. | 250/396 R |
| RE33,193 E | * | 4/1990 | Yamaguchi et al. | 250/492.2 |
| 5,149,976 A | * | 9/1992 | Sipma | 250/396 R |

FOREIGN PATENT DOCUMENTS

| | | |
|---|---|---|
| JP | 63228555 | 9/1988 |
| JP | 2295040 | 12/1990 |
| JP | 4251254 | 9/1992 |
| JP | 877957 | 3/1996 |

* cited by examiner

*Primary Examiner*—John R. Lee
*Assistant Examiner*—Johnnie L Smith, II
(74) *Attorney, Agent, or Firm*—Antonelli, Terry, Stout & Kraus, LLP

(57) ABSTRACT

In a projection ion beam machining apparatus having a liquid metal ion source, a combination of two or three electrostatic lenses arranged between the liquid metal ion source and a sample and a stencil mask exchangeably arranged in the combination of the electrostatic lenses, when a distance from substantial center of the electrostatic lens most proximate to the ion source and an ion emitting portion of the ion source is designated by Lo, a distance from the substantial center of the electiostatic lens most proximiate to the sample and the surface of the sample is designated by Li and a distance between the substantial centers of the two lenses is designated by L, by making a value of (L/Lo)(L/Li) equal to or larger than 400, current density on the sample of ion beam accelerated to several 10 kV for projecting a pattern of a stencil mask can be made equal to or larger than 20 mA per 1 square cm and resolution of edge can be made equal to or smaller than 0.2 $\mu$m when the size of the ion beam is 5 $\mu$m. As a result, a region having a size equal to or smaller than several 10 $\mu$m can be machined at speed several times or more as fast as that of FIB having equivalent machining accuracy.

12 Claims, 6 Drawing Sheets

PROJECTION ION BEAM MACHINING APPARATUS

TECHNICAL FIELD

The present invention relates to an ion beam machining apparatus for directly machining a very small portion of an electronic part, such as a semiconductor or the like, and, more particularly, to an ion beam machining apparatus which is capable of high speed machining by using a projection ion beam.

BACKGROUND OF THE INVENTION

In this technical field, there is a direct machining technology utilizing sputtering produced by irradiating a Focused Ion Beam (FIB) on a sample, and there is a method of observing a section of a semiconductor device or modifying wirings by using the machining technology (Japanese Unexamined Patent Publication No. 02-295040).

As is well known, a FIB is formed by focusing an ion beam emitted from a liquid metal ion source onto a sample using an electrostatic lens system to thereby produce an image of the ion source. The image of the ion source is very small and, therefore, there is provided a beam diameter determined mainly by aberration of the electrostatic lens system, and the size of which practically falls in a range of several 10 nm through several $\mu$m. Further, in the application thereof to direct machining, generally the acceleration voltage is set to 20 through 60 kV and the current falls in a range of several pA through 10 nA. The FIB can be irradiated to an arbitrary point and scanned in a region of about 1 mm at maximum on a sample by using an electrostatic deflector. In this case, in the case of using a FIB, due to the aberration of the electrostatic lens, when the current is increased, the beam diameter is enlarged. When the beam current reaches several nA, blur is rapidly enhanced due to the spherical aberration of the electrostatic lens and the current density is reduced. Therefore, the beam diameter is switched by changing the aperture or the focused state in accordance with the machining area and machining accuracy such that the machining speed is reduced as little as possible. Particularly, in forming a cross section of a sample for observation by a scanning electron microscope (SEM), as shown in FIG. 7(a), which is most generally carried out by machining using a FIB, a hole having a rectangular region of about 10 $\mu$m is dug to a similar degree of depth and machining is carried out by switching the beam to a slender beam successively twice through three times in order to finish only a face for observing the cross section. Further, a similar operation is carried out in forming a wall of a sample for observation by a transmission electron microscope (TEM), as shown in FIG. 7(b).

Further, there is known projection ion beam technology capable of forming a pattern with high accuracy. According to Japanese Unexamined Patent Publication No. 2-65117, the beam is used in lithography and an area having a size of several 10 mm is exposed by an accuracy of sub $\mu$m. It is regarded that, although the projection ion beam is suitable for irradiating a large area with a high accuracy, the beam is not suitable for an application which needs a high current density to carry out direct sputtering machining. In this case, a technology for carrying out high accuracy machining by applying an FIB apparatus to a projection ion beam apparatus is disclosed in Japanese Unexamined Patent Publication No. 8-213350. In accordance with this technology, the beam current is 10 nA at most, similar to that in a FIB, since the constitution of the FIB apparatus is used and there is no description with regard to a technology enabling high speed machining which can replace the FIB.

As described above, there is no known ion beam forming technology capable of realizing a machining speed exceeding that of a FIB and which is capable of forming a region of several 10 $\mu$m or smaller with an accuracy of sub $\mu$m.

It is an object of the present invention to provide a projection ion beam machining apparatus which is capable of machining a region having a size of several 10 $\mu$m or smaller, at high speed, and of processing an edge of the region with high accuracy by using an ion beam projecting a pattern of a member having an opening portion (stencil mask).

SUMMARY OF THE INVENTION

The present invention is based on optimum conditions in the design of an electrostatic lens system and indispensable matters in constituting an apparatus which we have found for constituting a projection ion beam apparatus capable of machining at high speed and with high accuracy in comparison with a FIB. The optimum conditions in the design of an electrostatic lens system referred to here are mainly optimum ranges of a distance between an ion source and a lens proximate to the ion source, a distance between a sample and a lens proximate to the sample and a distance between these two lenses. To satisfy such design conditions, specific combinations with regard to the constitution of the apparatus are needed.

An explanation will be given of conditions in the design of an electrostatic lens system. First, for simplicity an investigation has been made of a case in which two electrostatic lenses, that is, a lens 1 proximate to an ion source and a lens 2 proximate to a sample are used, as shown in FIG. 8(a) and FIG. 8(b). FIG. 8(a) shows a case of forming a FIB in which the intensities (inverse number of focal length) of the two lenses are adjusted such that an image of the ion source is formed on the sample by the ion beam. FIG. 8(b) shows a case of forming a projection ion beam in which the strength of the lens 2 is adjusted such that an image of a stencil mask is formed on the sample by the ion beam. In this case, the lens 1 is an illumination lens for adjusting the amount of irradiating ions which impinge onto the stencil mask, and the lens 1 converges the ion beam to a center of the lens 2. Further, the lens 2 is a projection lens for projecting the image of the mask onto the sample, and the lens 2 converges the ion beam radiated from respective points of the stencil mask onto the sample along trajectories shown as dashed lines in FIG. 8(b).

The following has been found by investigating characteristics of the two ion optical systems by calculation. That is, when the distance between the ion source and the center of the lens 1 is designated by notation Lo, the distance between the sample and the center of the lens 2 is designated by notation Li and the distance between the centers of the lens 1 and the lens 2 is designated by notation L, in the case of FIG. 8(a), the current density of the FIB on the sample is proportional to 1/(Lo×Li). In the meantime, in the case of FIG. 8(b), the current density of the projection ion beam on the sample is proportional to the square of L/(Lo×Li). That is, when a comparison is made with the same lens arrangement, a ratio of the current density of the projection ion beam as compared with the current density of the FIB is proportional to (L/Lo)(L/Li). Further, in the case of the projection ion beam, when the current density is increased, distortion is increased in proportion to the ninth power of Lo and the third power of Li even in a pattern having the same size and the same current density.

It has been found from the foregoing results that in the electrostatic lens system of the projection ion beam apparatus according to the present invention, it is necessary to increase L and reduce Lo and Li, and more particularly to reduce Lo to minimize the distortion to a degree which is not conceivable in the case of a FIB apparatus. For such purpose, it is indispensable to arrange all of the elements of the ion optical system, other than the electrostatic lenses, between the electrostatic lenses. In the meantime, when L is increased, the accuracy of the setting voltage of a lens power source necessary for adjusting the strength (inverse number of focal length) of the electrostatic lens proximate to the ion source becomes more and more severe and, accordingly, it has been found that there is an upper limit for L. However, it has been also found that this restriction can be alleviated and L can be effectively increased when the electrostatic lenses are increased in three stages. Further, it has been found that a focusing condition of the ion beam for minimizing the distortion of the projected pattern on the sample differs for each size of the pattern of the mask. Therefore, it has been found that there is needed a mechanism capable of switching the intensities of the respective electrostatic lenses in cooperation with the size of the pattern of the mask. The above-described discussion assumes that the ion beam passes on the central axes of the lenses, and it has been found that when the ion beam is disposed off of the axes (particularly in the lens proximate to the sample), the position of the projection ion beam on the sample is shifted and an edge of the pattern is significantly distorted. Hence, it has been found that a deflector for always accurately guiding the ion beam on the axes is indispensable. Further, it has been found that when the strength of the lens for projecting the mask is inaccurate, the size of the pattern of the ion beam on the sample is varied. Hence, it has been found that in order to confirm the condition of the projection lens, means for effectively moving the ion source, that is, a deflector arranged on the ion source side of the mask, is indispensable.

Specifically, the problem is solved by a projection ion beam machining apparatus provided with an ion source, a stage for holding a sample, a first electrostatic lens disposed between the ion source and the stage and provided on the side of the ion source, a second electrostatic lens provided on the side of the stage, a mask having an opening portion provided between the first electrostatic lens and the second electrostatic lens, a first electrostatic deflector provided between the mask and tile first electrostatic lens and two stages of electrostatic deflectors provided between the second electrostatic lens and the mask.

Further, in the above-described projection ion beam machining apparatus, the first electrostatic lens is a lens synthesized by arranging an acceleration lens having two electrodes and an Einzel lens having three electrodes (lens in which potentials of the electrodes at both ends are the same) successively from the side of the ion source.

Furthermore, in the above-described projection ion beam machining apparatus, an aperture is arranged between the acceleration lens having the three electrodes and the Einzel lens having the three electrodes.

Furthermore, in the above-described projection ion beam machining apparatus, the second electrostatic lens is an Einzel lens.

Furthermore, the above-described projection ion beam machining apparatus has an electrostatic deflector for blanking the ion beam on the side of the ion source of the second electrostatic lens and a fixed aperture arranged on the side of the sample of the electrostatic deflector.

Furthermore, in the above-described projection ion beam machining apparatus, the ion source is a liquid metal ion source.

Furthermore, in the above-described projection ion beam machining apparatus, the sample is machined with a high sputtering efficiency by making the acceleration voltage of the ion beam equal to or higher than 20 kV and equal to or lower than 60 kV.

Further, in the above-described projection ion beam machining apparatus, the mask is provided with a group of a plurality of selectable openings and a control system for controlling operation of the electrostatic lens system is provided with means for storing two sets or more of control parameters and means for changing the sets of the control parameters for respective ones of the openings of the mask.

Furthermore, in the above-described projection ion beam machining apparatus, at least one of the openings of the mask is formed in a circular shape.

Further, the above-described projection ion beam machining apparatus has means for detecting secondary particles (secondary elections, secondary ions or secondary beam) emitted from the sample, means for scanning the ion beams on the sample by using the two stages of electrostatic deflectors provided between the second electrostatic lens and the mask or the electrostatic deflector provided between the mask and the first electrostatic lens and means for forming and displaying an image of the sample by using an output signal provided from the means for detecting the secondary particles in synchronism with the scanning.

Furthermore, the above-described projection ion beam machining apparatus has means for designating a position for irradiating the projection ion beam onto the sample by using a display of a one-dimensional or two-dimensional image of the sample.

Furthermore, the problem is solved by a projection ion beam machining apparatus which is provided with a liquid metal ion source, a stage for holding a sample, a combination of two or three electrostatic lenses arranged between the ion source and the sample and a mask having opening portions disposed in the combination of the electrostatic lenses, wherein, when the distance between substantial center of the electrostatic lens most proximate to the ion source and an ion emitting portion of the ion source is designated by notation Lo, the distance between a substantial centers of the electrostatic lens most proximate to the sample and a surface of the sample is designated by notation Li and the distance between the substantial centers of the two lenses is designated by notation L, a value of (L/Lo)(L/Li) is equal to or larger than 400.

Further, the problem is solved by a projection ion beam machining apparatus which is provided with a liquid metal ion source, a stage for holding a sample, a combination of two or three electrostatic lenses arranged between the ion source and the sample and a mask having opening portions arranged in the combination of the electrostatic lenses, wherein the distance between an ion emitting portion of the ion source to a surface of the sample is equal to or larger than 400 mm and is equal to or smaller than 1500 mm, the distance from the ion source to an end of a side of the sample of the electrostatic lens most proximate to the ion source is equal to or smaller than 40 mm and the distance from an end of a side of the ion source of the electrostatic lens most proximate to the sample to a surface of the sample is equal to or smaller than 40 mm.

Further, the problem is solved by a projection ion beam machining apparatus which is provided with an electrostatic lens system for forming an ion beam for projection an opening pattern of a mask having an opening portion onto a sample held by a sample stage, wherein the current density of the ion beam on the sample is equal or larger than 20 mA per one square cm.

Furthermore, in the above-described projection ion beam machining apparatus, the edge resolution power, when the size of the ion beam on the sample is 5 μm, is equal to or smaller than 0.2 μm.

BEST MODE FOR CARRYING OUT THE INVENTION

An explanation will be given of the present invention with reference to the attached drawings in order to describe the present invention in further detail.

Figure 1:
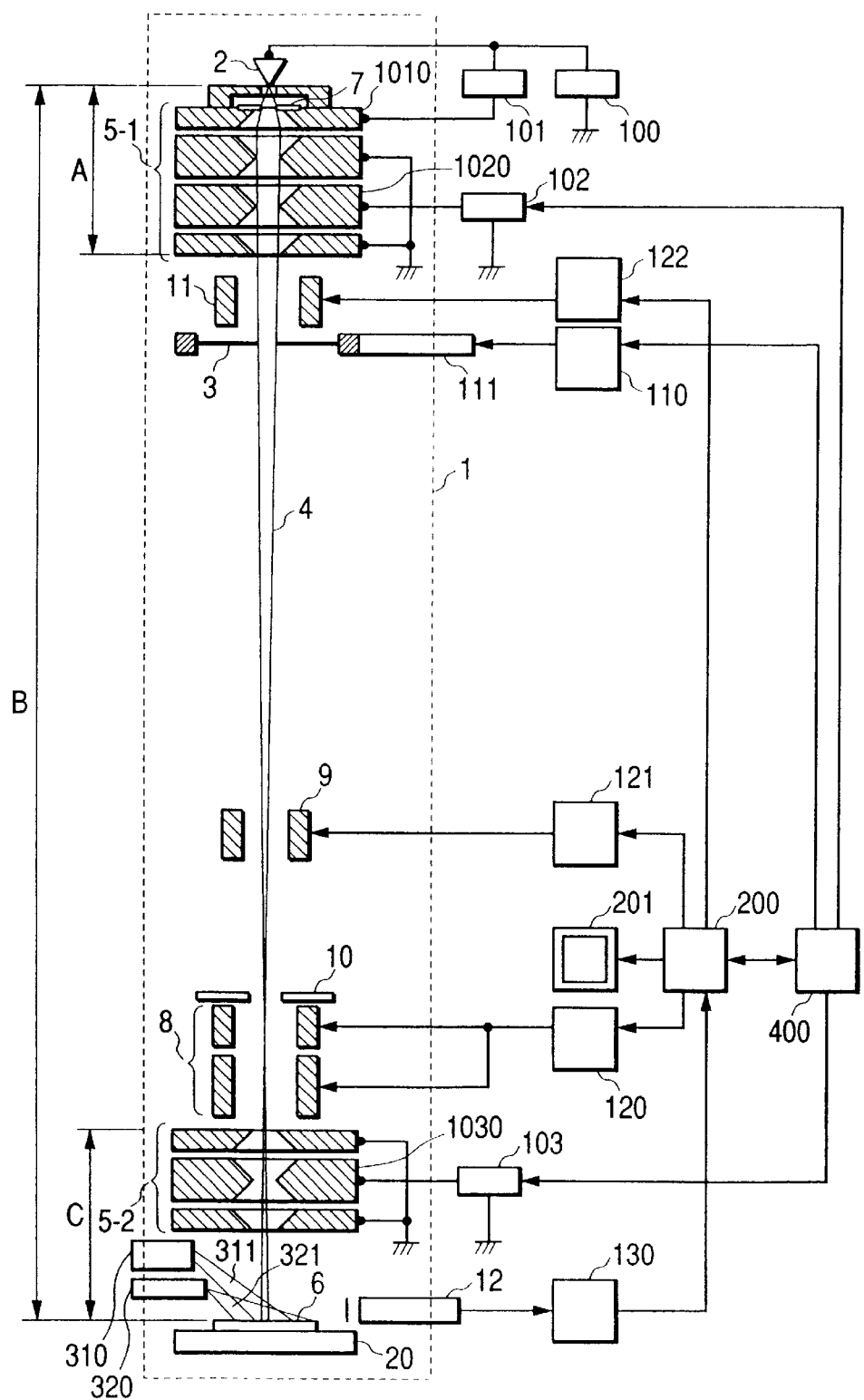
FIG. 1 is a diagram showing the total constitution of a projection ion beam machining apparatus according to the present invention.

FIG. 1 is a sectional view showing a projection ion beam machining apparatus according to an embodiment of the present invention. An apparatus main body 1 is provided with a liquid metal ion source 2 of Ga, a stencil mask 3, an illumination lens 5-1 and a projection lens 5-2 which are electrostatic lenses of two stages, and a sample stage 20 for movably holding a sample 6, which are basic constituent elements of the projection ion beam apparatus. Other than these, there are provided an electrostatic reflector 8 of two stages, a blanking deflector 9, a blanking aperture 10, a lens condition setting deflector 11 and a secondary electron detector 12. Further, there are provided an electron source 310 and a gas source 320. In the drawing, a vacuum chamber containing these elements has been omitted. The ion source 2 is connected with an acceleration power source 100, and the acceleration voltage of the ion beam 4 on the sample 6 is determined by the power source voltage. An electrode 1010 of the illumination lens 5-1 on a side thereof most proximate to the ion source serves also as an ion extracting electrode and is connected with an ion extracting power source 101. A power source 102 is connected to a central electrode 1020 of an Einzel lens portion of the illumination lens 5-1 and the strength of the lens can be changed by the power source voltage. A central electrode 1030 of the projection lens 5-2 is connected with a lens power source 103 and the strength of the lens can be changed by the power source voltage. The mask 3 is exchangeably held by a drive mechanism 111 and the drive mechanism 111 is connected with a drive power source 110 for selecting one of a plurality of openings on the mask by movement thereof. The electrostatic deflector 8 of two stages is connected with a deflector power source 120. The blanking deflector 9 is connected with a deflector power source 121. The deflector 11 for setting the lens condition is connected with a deflector power source 122. The secondary electron detector 12 is connected with a signal amplifier 130. In this case, a beam control circuit 400 can control the acceleration power source 100, the ion extracting power source 101, the lens power source 102, the lens power source 103 and the drive power source 110 and can store settings for these power sources. Further, a deflector control circuit 200 can input a signal from the signal amplifier 130 in cooperation with operation of the deflector power source 120 or 122 and can form a one-dimensional or two-dimensional image and display the image on a display 201.

Next, an explanation will be given of the operation of the apparatus. The beam amount of the ion beam 4 emitted from the ion source 2 is controlled by an ion aperture 7, it is accelerated and focused by the illumination lens 5-1 and it is irradiated onto the stencil mask 3. In this case, the acceleration voltage of the ion beam 4 is 30 kV and the current of the extracted ions is 2 μA. Further, the strength of the illumination lens 5-1 is set by the beam control circuit 400 such that the ion beam 4 is provided with a minimum beam diameter at the center of the projection lens 5-2. Next, the ion beam 4 which has passed through the mask 3 is irradiated on the sample 6 held by the sample stage 20 by passing through the projection lens 5-2. In this case, the strength of the projection lens 5-2 is set by the beam control circuit 400 such that the ion beam which diverges after passing through an arbitrary point of the mask 3 is focused on the sample. Therefore, a pattern of the opening of the mask 3 is projected onto the sample 6 by the ion beam 4 by operation of the projection lens 5-2.

The most characteristic point of the embodiment resides in the fact that the size of the ion optical system significantly differs from an ion optical system of an FIB apparatus in order to form the projection ion beam having a high current density. Further, the size significantly differs also from the size of an ion optical system of a conventional projection ion beam apparatus. That is, whereas the distance L between the centers of the illumination lens 5-1 and the projection lens 5-2 is about 200 mm in a normal FIB apparatus, in this apparatus, the distance is about 550 mm, which is twice or more as long as the above-mentioned length. Further, the distance Lo between the centers of the ion source 2 and the illumination lens 5-1 is made as short as about 20 mm. For this purpose, for the illumination lens 5-1, there is adopted an axisymmetrical lens having four electrodes integrated with an acceleration lens having two electrodes and an Einzel lens having three electrodes (lens in which potentials of electrodes at both ends are the same) by successively arranging them from the side of the ion source. (One sheet of an electrode connected to the ground is commonly provided.) The Einzel lens portion is operated in a deceleration mode which is liable to constitute a short focus formation. (The lens power source 102 is a positive power source.) Further, the distance Li between the projection lens 5-2 and the sample 6 is made as short as about 11 mm. For that purpose, the electrostatic deflector 8 is arranged on the side of the ion source of the projection lens 5-2 and the space between the sample and the projection lens 5-2 is reduce.

Further, for the projection lens 5-2, there is adopted an Einzel lens operating in a deceleration mode to constitute the projection lens 5-2 as a lens having a short focus. (The lens power source 103 is a positive power source.) In this case, a distance B between the ion source 2 and the sample 6 is 600 mm. Further, the distance A from the ion source 2 to an end of the illumination lens 5-1 on the sample side is 30 mm and the distance C from the sample 6 to an end of the projection lens 5-2 on the side of the ion source is 21 mm. Further, (L/Lo)(L/Li) is about 1380. By the above-described design, according to the apparatus, the pattern of the mask 3 can be projected onto the sample 6 by a reduction rate of 1/45. Further, the current density of the ion beam 4 on the sample 6 is 28 mA per 1 square cm.

Figure 2:
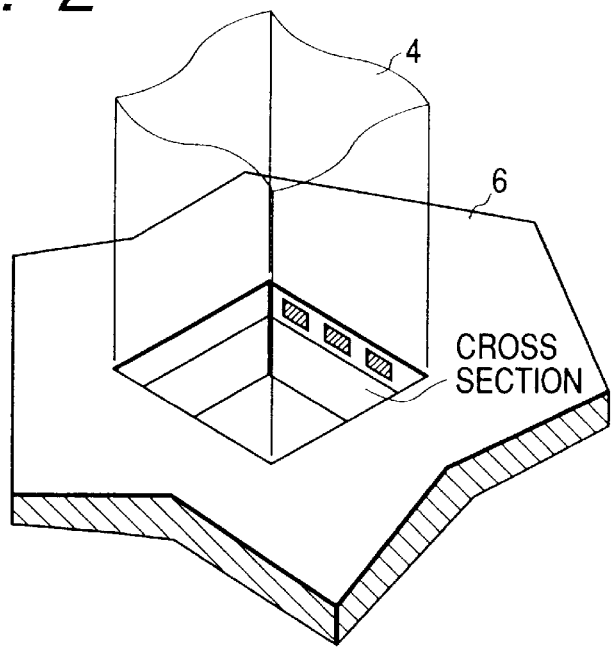
FIG. 2 is a perspective view of a sample, a section of which is being processed by a projection ion beam.

FIG. 2 shows the result of forming a cross section by the apparatus. A hole is formed in one operation and at high speed by projecting the ion beam 4 to a region which is 10 $\mu$m square on the sample 6 by using a pattern which is 450 $\mu$m square on the mask. There is formed a cross section having inconsiderable edge sagging suitable for observation by an SEM or the like at a wall face of the hole. The current of the ion beam 4 on the sample is 28 nA and the resolution of the edge in the machining region is about 10 nm. The time period required for forming a hole having a depth of about 10 $\mu$m is about 3 minutes. The current density of a FIB is generally about 10 A per 1 square cm and, accordingly, when the beam diameter is set to 0.1 $\mu$m, the current becomes about 1 nA. When the function of the apparatus is compared with that of a FIB, not only can the hole be machined at a speed 28 times as fast as that of a FIB, but also the section can be formed with an accuracy 10 times as high as that of a FIB. In this case, when the sample 6 is an insulating member, by irradiating an electron shower 311 from the electron source 310 onto the sample 6, electrification in irradiating the ion beam 4 can completely be prevented. However, when the electron shower is used, it is necessary to detect secondary ions and form an image of the sample by changing the polarity of the secondary electron detector 12. Further, the flatness of the section can be improved by machining the hole after piling up a tungsten-like film by about several thousands nm by irradiating the ion beam 4 onto the sample 6, while blowing gas 321 of tungsten carbonyl W(CO)6 from the gas source 320. Further, when gas of xenon fluoride XeF2 or the like is used, the machining by the ion beam 4 is accelerated in a material of a portion of the sample.

Figure 3:
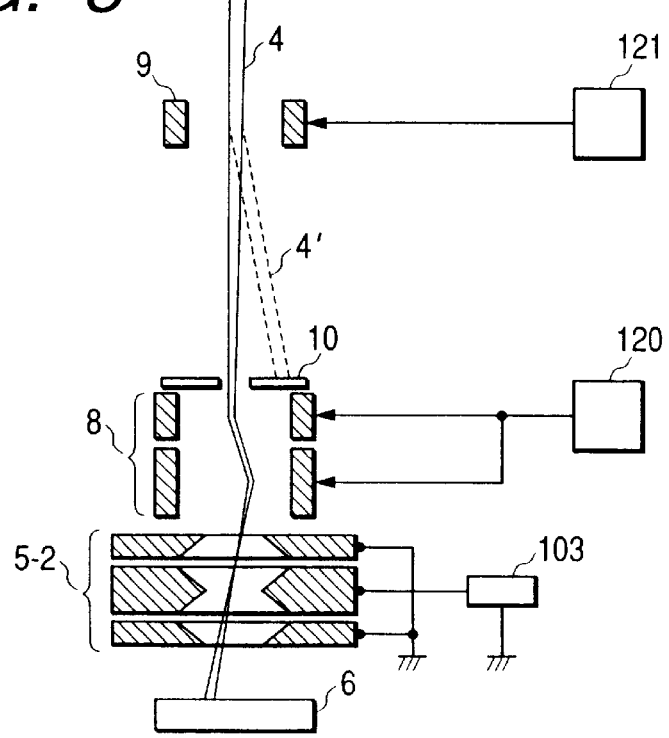
FIG. 3 is a diagram showing the operation of an electrostatic deflector of the projection ion beam machining apparatus according to the present invention.

A second characteristic point of the embodiment resides in providing means for ensuring that the ion beam is always incident on the central axis of the projection lens in order to irradiate the projection ion beam to an accurate position on the sample by reducing distortion of the pattern. That is, as shown in FIG. 1, the ion beam 4 is deflected to align with the central axis of the projection lens 5-2 by using the lens condition setting deflector 11. Further, the position where the ion beam 4 is irradiated onto the sample 6 is set with high accuracy by deflecting the ion beam 4 to always pass through the center of the projection lens 5-2 by using the electrostatic deflector 8 of two stages. Here, FIG. 3 shows the operation of the projection lens 5-2 of the projection ion beam machining apparatus of FIG. 1. The two stage deflector 8 is constituted by overlapping eight poles electrostatic deflectors in two stages. Although, according to the deflecting circuit 120, the same set voltage is applied to a stage on the side of the ion source and a stage on the side of sample of the two stage deflector 8, the wirings are connected asymmetrically. The ion beam 4 is made to pass always through the center of the projection lens 5-2 by optimizing a ratio of the lengths of the deflectors of two stages. The position at which the ion beam 4 is irradiated on the sample 6 can be set within a range of a size of 500 $\mu$m square and distortion or blur of the pattern is equal to or smaller than 10 m in a range of a radius of 50 $\mu$m. According to the conventional projection ion beam apparatus, there been no example in which the irradiation position call be varied to be larger than the size of the irradiation pattern. The sample can be machined to have a shape different from the pattern of the mask by scanning the ion beam 4 on the sample the deflector 8. Particularly, when the ion beam 4 is scanned in parallel with a straight line portion of the pattern of the mask, the machining can be carried out without deterioration the edge resolution of the machining region. The same is true with a case in which the sample stage 20 is scanned to thereby relatively move the ion beam 4. Further, conversely, the ion beam 4 can be prevented from relatively moving on the sample 6 by moving the sample 6 using the sample stage 20 as the ion beam 4 is moved. In this case, the control power source 200 may be provided with a function of adjusting the deflection voltage of the deflector 8 to correct any variation in the position of the ion beam 4 relative to the sample stage 20. Further, the lens condition setting deflector 11 is arranged on the ion source side of the mask 3 to prevent a variation in the size of the pattern of the ion beam 4 on the sample 6 by accurately setting the strength of the projection lens 5-2. In this case, when the ion beam 4 is deflected by the lens condition setting deflector 11, the pattern of the mask 3 can be accurately projected onto the sample 6 by setting the strength of the projection lens 5-2 such that the position of the ion beam 4 is not varied on the sample 6. This utilizes the fact that when the strength of the projection lens 5-2 for projecting the pattern of the mask 3 is pertinently set, the position of the ion beam 4 on the sample 6 is not varied even in the case in which the position of the ion source 2 is effectively varied. Here, considering a case in which different locations on the sample 6 are continuously machined, when the height of the sample is changed, the condition of projecting the projection ion beam 4 is deviated and the size of the machining pattern is changed. It takes time and is not suitable to adjust the strength of the projection lens 5-2 in the above-described procedure as a countermeasure thereagainst. In this case, the strength of the projection lens 5-2 may be changed by an amount in proportion to the change in the height of the sample by detecting the change in the height of a portion of the sample for irradiating the ion beam using a reflected light sensor or the like. It is a well known method to carry out this operation by automatic control.

A third characteristic in the embodiment resides in providing means for controlling the time period during which the projection ion beam is irradiated onto the sample with high accuracy. That is, as shown by FIG. 3, by deflecting the ion beam 4 as in ion beam 4' using the blanking deflector 9 and irradiating the ion beam 4' onto the blanking aperture 10, the ion beam 4' is cut off from above the sample 6 at high speed. By arranging the blanking deflector 9 and the blanking aperture 10 on the ion source side of the projection lens 5-2, the interval between the projection lens 5-2 and the sample 6 is minimized. Further, by arranging these elements on the sample side of the mask 3, the current of the ion beam actually irradiated on the sample can be measured at a portion of the blanking aperture 10. By calculating the machining speed using the beam current, the time period during which ions are irradiated on the sample for differing a necessary depth can be accurately calculated. The blanking deflector 9 is an electrostatic deflector of two poles and the ion beam 4 can be fully deflected by a rise time of about 1

μs by supplying a voltage from the blanking deflector power source 121. The deflector power source 121 is controlled by the deflector control circuit 200 for controlling the time period during which the ion beam is irradiated on the sample.

Figure 4:
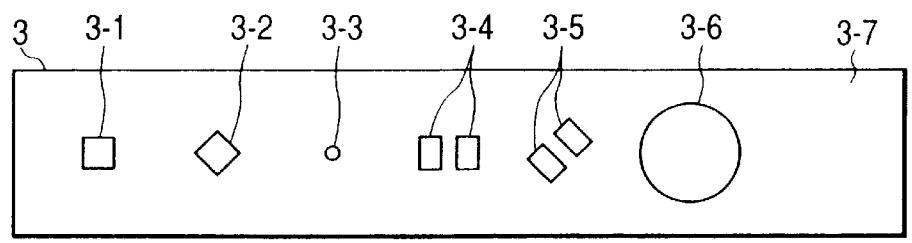
FIG. 4 is a diagram showing a stencil mask of the projection ion beam machining apparatus according to the present invention.

A fourth characteristic in the embodiment resides in providing a plurality of selectable openings on the mask and providing the beam control circuit 400 for storing a condition of focusing for an optimum ion beam for each of the plurality of openings (lens condition) at a storing portion thereof and arbitrarily changing the condition. Further, there is also provided means for confirming the optimum conditions using an image of the sample. The more the opening pattern is located toward the outside of the mask, the more distortion is liable to be caused when the pattern is projected on the sample. In order to reduce the distortion as much as possible, it is necessary to adjust the illumination lens 5-1 such that the ion beam 4 is provided with a minimum beam diameter at the center of the projection lens 5-2. The beam diameter is controlled by the spherical aberration of the illumination lens 5-1 and, therefore, the larger the size of the pattern, the more the strength of the illumination lens 5-1 needs to weaken. In the meantime, in reducing distortion or blur at the central portion of the opening pattern, the strength of the illumination lens 5-1 needs to be optimized first using a small pattern. A top view of the stencil mask 3 in FIG. 1 is shown by FIG. 4. The stencil mask 3 is provided with a plurality of openings. An opening 3-1 and an opening 3-2 are rectangular and are used when the hole for forming the cross section of the sample shown by FIG. 2 is machined. Angles of the two openings are made to differ from each other by 45 degrees to align the direction of the cross section relative to the direction of the semiconductor pattern in forming the cross section of a semiconductor sample. In each of an opening 3-4 and an opening 3-5, two rectangles are aligned in line symmetry. These openings are used for machining holes to form a thin wall in a sample shown by FIG. 5. A closed area 3-7 is used as a shutter for cutting the ion beam 4. A lens condition is set to each of these openings as follows. First, the mask 3 is moved, an opening which is intended for use is set to the center of the ion optical system and the ion beam 4 is scanned using the ion beam position adjusting deflector 8. Next, there is observed an image of the sample formed by acquiring an intensity signal of secondary electrons generated from the sample 6 in synchronism with the scanning operation. In this case, the illuminated lens 5-1 may be adjusted such that a change in solution in the image of the sample is minimized while varying the strength of the projection lens 5-2. However, the strength of the projection lens 5-2 needs to be pertinently set previously. This can simply be set by the following method. First, the mask 3 is moved, a smallest circular opening 3-3 is set to the center of the ion optical system and the ion beam 4 is scanned using the lens condition setting deflector 11. Next, there is observed the image of the sample formed by acquiring the intensity signal of the secondary electrons generated from the sample 6 in synchronism with the scanning operation. Here, the projection lens 5-2 may be adjusted such that the change in the intensity in the image of the sample is minimized. Here, a pertinent rectangular mark is provided on the sample 6 and the position of the ion beam 4 can be calibrated from the signal of the secondary electrons provided by scanning the ion beam 4 on the rectangular mark using the deflector 8. Further, the image of secondary electrons provided by scanning the ion beam 4 projecting the smallest circular opening 3-3 on the sample 6 by the deflector 8 is displayed on the display 201, and based on the image, the position for irradiating the ion beam at another opening can be designated. Another simple method is a method of designating the position for irradiating the ion beam using an image of the sample formed by a FIB. First, in FIG. 1, the opening 3-3 of the mask 3 is set to the center of the ion optical system. Next, the intensities of the illumination lens 5-1 and the projection lens 5-2 are set such that the image of the ion source 2 is projected onto the sample 6. This is the condition for forming a FIB. As mentioned above, the present apparatus is provided with means for storing the lens condition for each of the openings of the mask and instantaneously changing the lens condition when needed. By scanning the ion beam 4 constituting a FIB on the sample 6 using the deflector 8, the image of the sample having a high resolution can be formed by secondary electrons generated from the sample. Although there is a restriction in the machined shape in the ion beam projecting the pattern of the mask, when a FIB is formed by changing the lens condition as mentioned above, the sample can be machined successively in an arbitrary shape.

Figure 6:
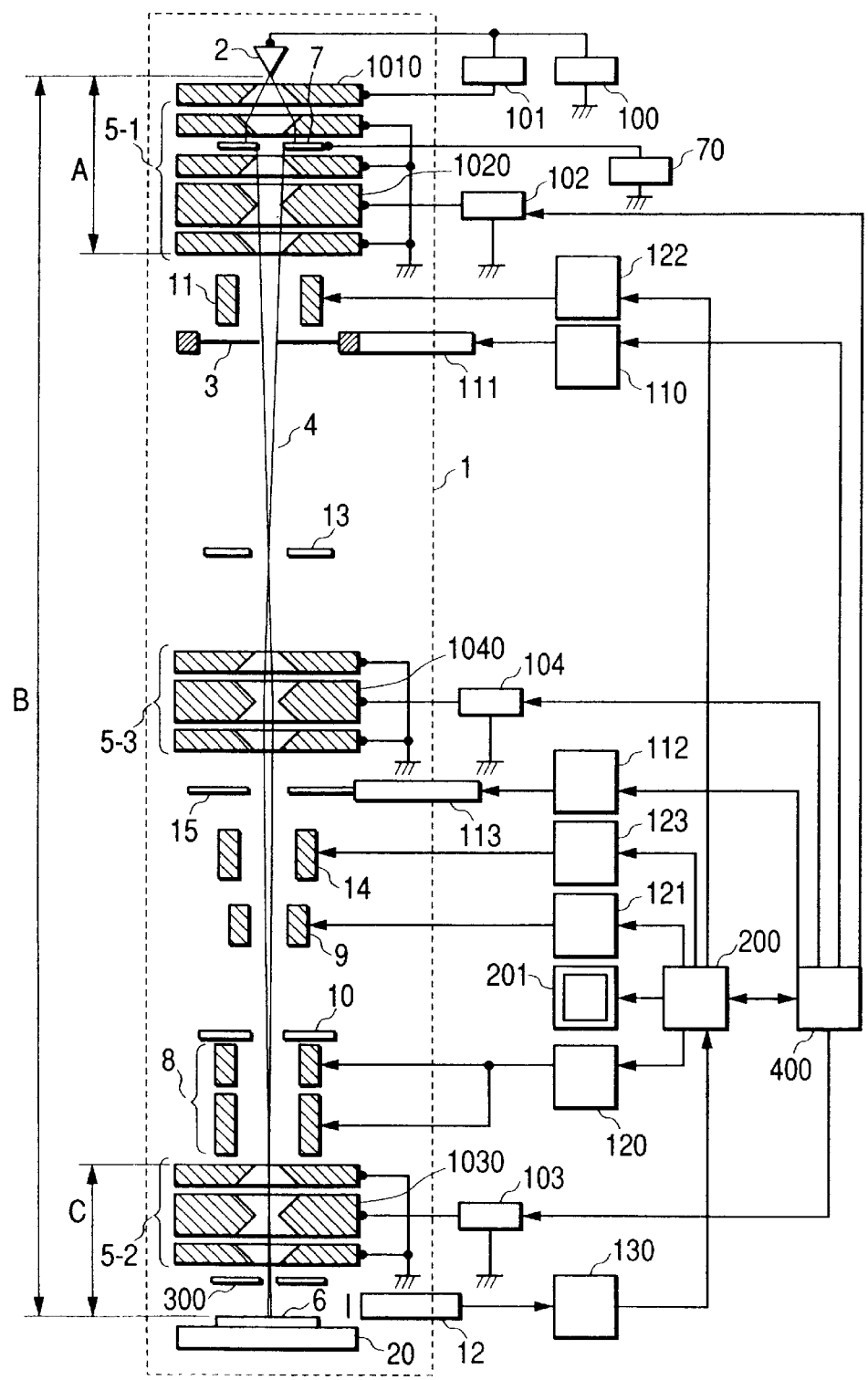
FIG. 6 is a diagram showing the total constitute of another embodiment of a projection ion beam machining apparatus according to the present invention.
Figure 7A:
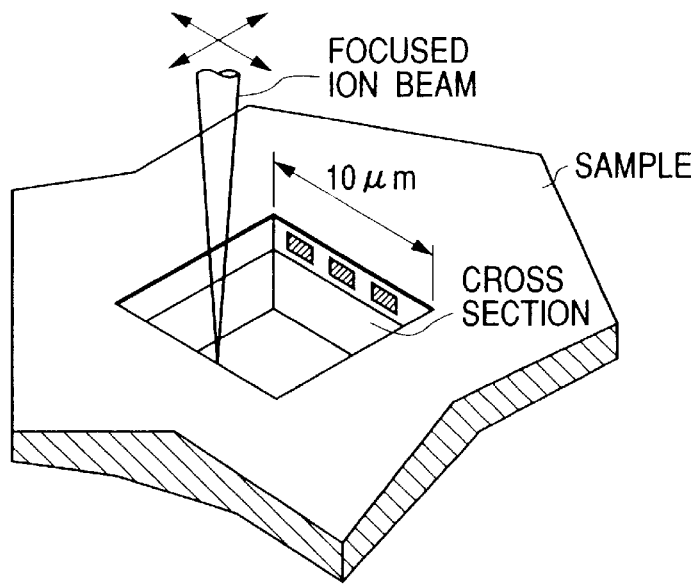
FIGS. 7(a) and 7(b) are perspective views of samples which are being machined by a focused ion beam (FIB).
Figure 7B:
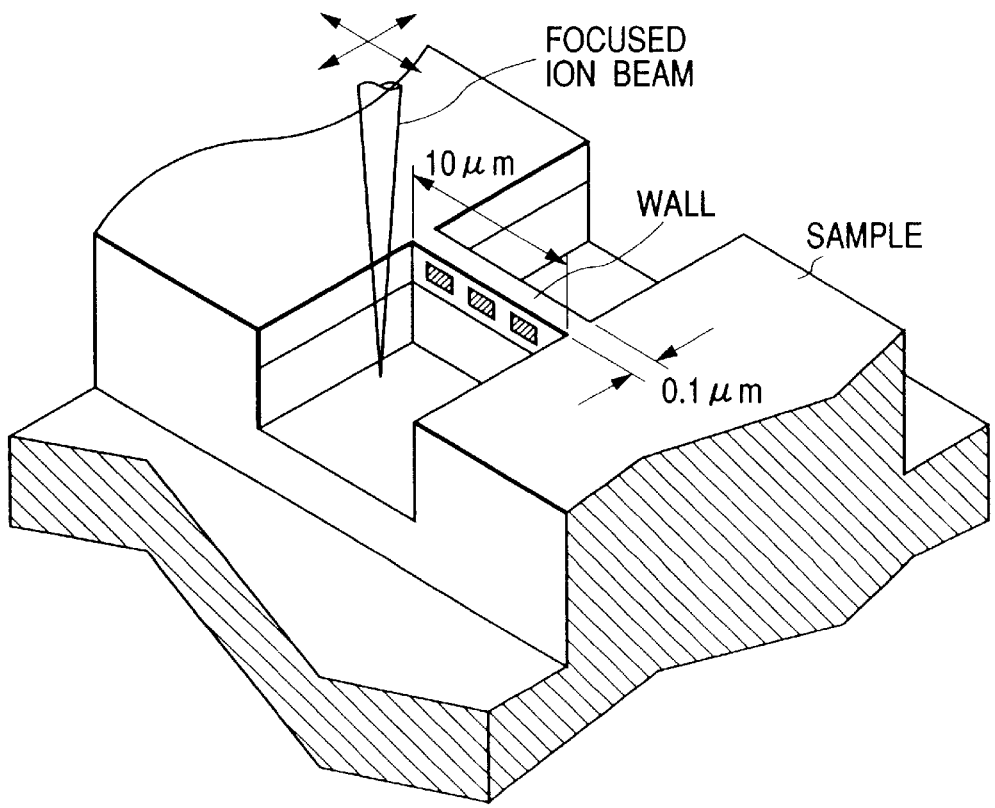

FIG. 6 is a diagram of a projection ion beam machining apparatus according to a second embodiment of the present invention. The apparatus main body I is provided with the liquid metal ion source 2 of Ga, the stencil mask 3, an illumination lens 5-1 comprising three electrostatic lenses, a first projection lens 5-2 and a second projection lens 5-3 and a sample stage 20 for movably holding a sample 6, which are basic constituent elements of the projection ion beam apparatus. Otherthan these, there are provided an electrostatic deflector 8 of two stages, a blanking deflector 9, a blanking aperture 10, a lens condition setting deflector 11 and a secondary electron detector 12. Further, there are provided a fixed aperture 13, an alignment deflector 14, a movable aperture 15 and a contamination preventive aperture 300. A vacuum chamber containing these elements is omitted in the drawing. The ion source 2 is connected with an acceleration power source 100. The acceleration voltage of the ion beam 4 on the sample 6 is determined by the voltage of the acceleration power source 100. The electrode 1010 on the side of the illumination lens most proximate to the ion source services also as the electrode for extracting ions, which electrode is connected to the ion extracting power source 101. The lens power source 102 is connected to the central electrode 1020 of the Einzel lens portion of the illumination lens 5-1 and the strength of the lens is changed by the power source voltage. The central electrode 1030 of the projection lens 5-2 is connected with the lens power source 103 and the strength of the lens is changed by the power source voltage. A central electrode 1040 of the projection lens 5-3 is connected with a lens power source 104 and the strength of the lens is changed by the power source voltage. The mask 3 is movably held by the drive mechanism 111, which is connected with the drive power source 110 for selecting one of a plurality of openings on the mask. The movable aperture 15 is connected with a drive mechanism 113, which receives power from a drive power source 112. The electrostatic deflector 8 of two stages is connected with the deflector power source 120. The blanking deflector 9 is connected with the deflector power source 121. The lens condition setting defector 11 is connected with the deflector power source 122. The alignment deflector 14 is connected with a deflector power source 123. The secondary electron detector 12 is connected with the signal amplifier 130. In this case, the beam control circuit 400 can control the acceleration power source 100, the ion extracting power source 101, the lens power source 102, the lens power source 103, the lens power source 104 and the drive power source 110 and can store the settings of these power sources. Further, the deflector control circuit 200 can input a signal from the signal amplifier 130 in cooperation with the operation of the deflector power source 120, the deflector power source 122 or the deflector power source 123 and can form a one-dimensional or two-dimensional image and display the image on the display 201.

Next, an explanation will be given of the operation of the apparatus. The beam amount of the ion beam 4 emitted from the ion source 2 is controlled by the ion aperture 7, the ion beam 4 is accelerated and focused by the illumination lens 5-1 and is irradiated onto the stencil mask 3. In this case, the acceleration voltage of the ion beam 4 is 30 kV and the current for extracted ions is 2 $\mu$A. Further, the strength of the illumination lens 5-1 is set by the beam control circuit 400 such that the ion beam 4 is provided with a minimum beam diameter at the center of the fixed aperture 13. Further, the strength of the projection lens 5-3 is set by the beam control circuit 400 such that the ion beam 4 is provided with a minimum beam diameter at the center of the projection lens 5-2. Next, the ion beam 4 which has passed through the mask 3 is focused by the projection lens 5-2 and the projection lens 5-3 and is irradiated onto the sample 6. In this case, the projection lens 5-2 and the projection lens 5-3 are set by the beam control circuit 400 such that the ion beam which passes through an arbitrary point on the mask 3 and is diverged is focused on the sample. As mentioned above, the pattern of the opening of the mask 3 is projected onto the sample 6 by the ion beam 4.

Figure 8A:
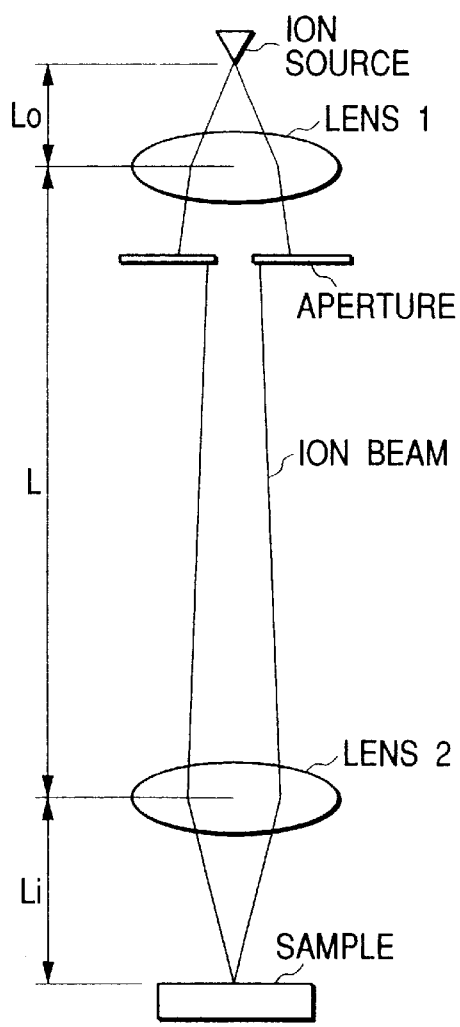
FIGS. 8(a) and 8(b) are diagrams showing a comparison of the operations of a focused ion beam optical system and a projection ion beam optical system.
Figure 8B:
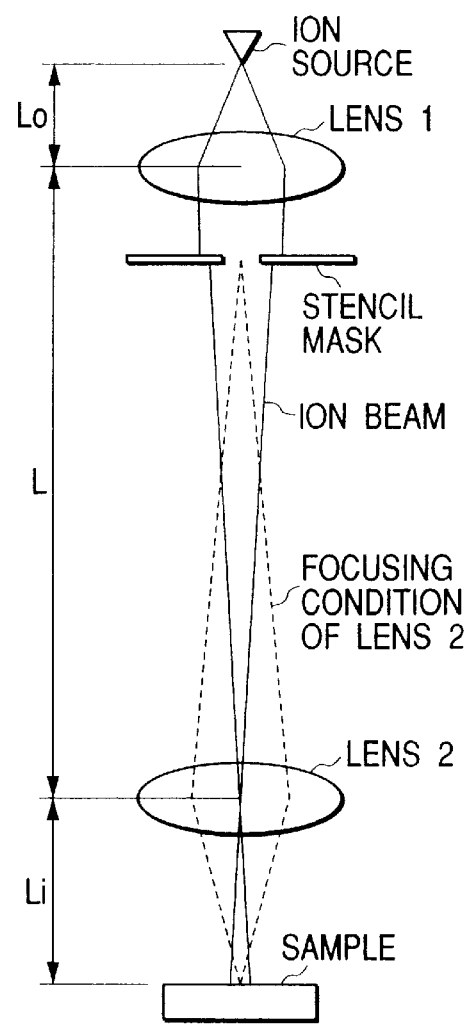

The first characteristic point of the embodiment resides in using three electrostatic lenses. Thereby, in comparison with the projection ion beam machining apparatus according to Embodiment 1, a projection ion beam can be formed which has a higher current density. In the projection ion beam optical system using two lenses, as shown in FIG. 8(*b*), when L is simply prolonged in order to increase the current density, adjustment of the strength of the electrostatic lens 1 becomes delicate. That is, high resolution is needed in setting the voltage of the electrostatic lens. Actually, there is needed an accuracy equal to or lower than 10 $\mu$m in setting L, however, when L exceeds 1000 mm, the situation becomes difficult to deal with by an ordinary high voltage power source and the resolution of the digital analog converter (DAC). Hence, according to the embodiment, as shown in FIG. 6, the operation of focusing the ion beam 4 to the center of the first projection lens 5-2 is carried out by allotting the operation to the illumination lens 5-1 and the added second projection lens 5-3. Thereby, resolutions necessary for setting the voltage to the respective lenses are brought into practical ranges. In this case, the distance B between the ion source 2 and the sample 6 is 600 mm. Further, the distance A from the ion source 2 to the end of the sample side of the illumination lens 5-1 is 31 mm and the distance C from the sample 6 to the end of the ion source side of the projection lens 5-2 is 21 mm. Although the distance L between the centers of the illumination lens 5-1 and the projection lens 5-2 is about 550 mm, an effective value of L (L for providing a similar function using lenses of two stages) is 1250 mm. Further, although (L/Lo)(L/Li) is about 2290, the value is about 11900 effectively. By the above-described design, according to the apparatus, the pattern of the mask 3 can be projected onto the sample 6 by a reduction rate of $\frac{1}{100}$ and the current density of the ion beam 4 on the sample 6 is 400 mA per 1 square cm. Further, there is a possibility of shifting the optical axis since the number of lenses is increased to three stages, and, accordingly, it is preferably to provide the alignment deflector 16 for the correction.

Figure 5:
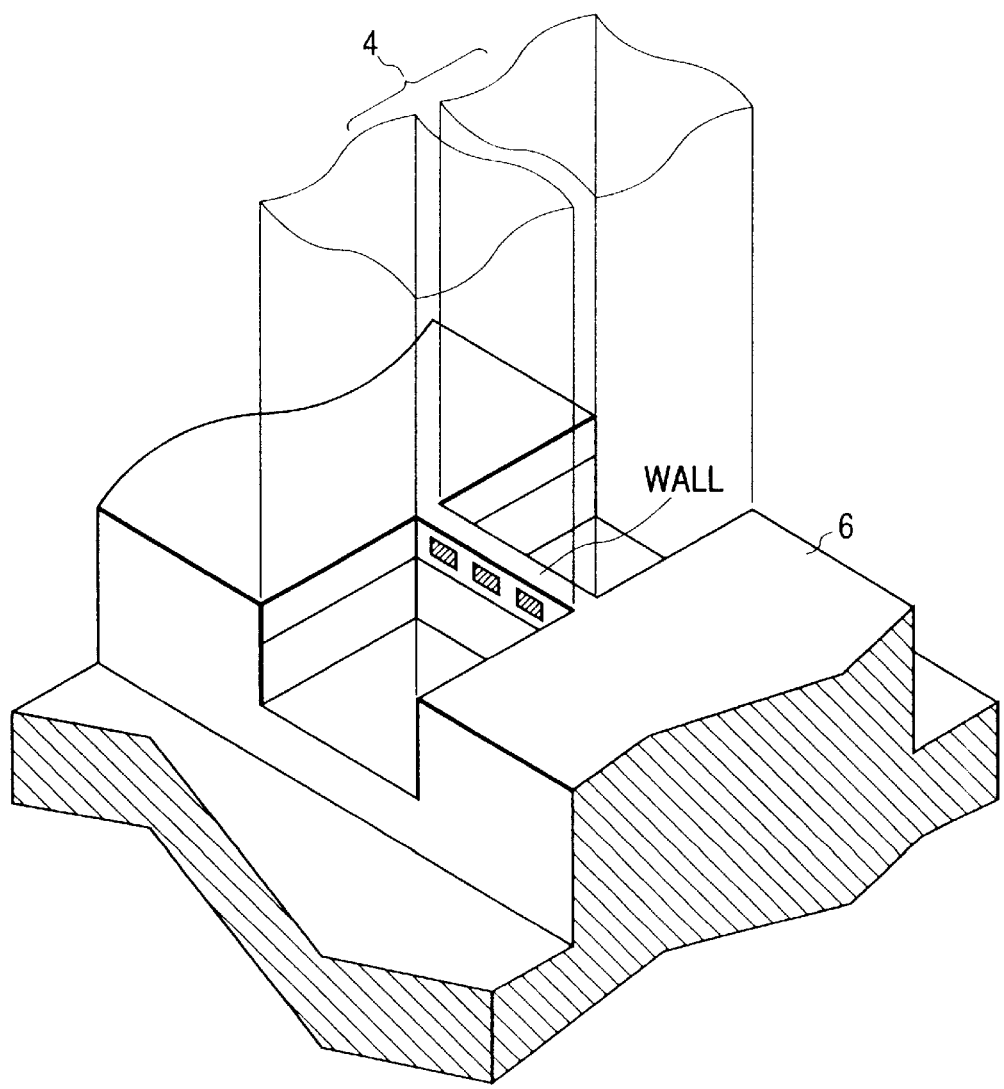
FIG. 5 is a perspective view of a sample, a wall of which is being formed by a projection ion beam.

An explanation will be given of the procedure for forming a wall-like structure for TEM observation on the sample, as shown in FIG. 5. A wall structure having a length of 3 $\mu$m and a width of 0.1 $\mu$m can be formed in one operation and at high speed by projecting two rectangular patterns each having a size of 300 $\mu$m×200 $\mu$m square, which are arranged at an interval of 10 $\mu$m on the mask, onto the sample 6 using the ion beam 4. The current of the ion beam 4 on the sample 6 is 48 nA and the resolution of an edge of a machining region is about 20 nm. The time period required for forming a hole having a depth of about 10 $\mu$m is about 3 minutes. When such a high speed machining is continuously carried out, a large amount of the substances sputtered from the sample 6 adhere to the contamination preventive aperture 300 in FIG. 6. When the sample 6 is provided with an insulating property, there is a possibility that the position of the ion beam 4 will be changed due to electrification by the adhered substances. Therefore, the contamination preventive aperture 300 is grounded and is installed such that the single member aperture can pertinently be interchanged.

Further, in FIG. 6, even when the stencil mask 3 is provided at the position of the movable aperture 15, the projection ion beam 4 having a similar current density can be formed by pertinently setting the strength of the projection lens 5-2. However, in that case, patterns on the stencil mask need to have smaller sizes. Further, in FIG. 6 a FIB can be formed by adjusting the illumination lens 5-1, the illumination lens 5-2 and the illumination lens 5-3 to pertinent intensities. In this case, a slender FIB can be formed by restriction the ion beam 4 using the movable aperture 15.

A second characteristic point of the embodiment resides in using a special constitution in the first stage of the electrostatic lens. Thereby, in comparison with the projection ion beam machining apparatus of Embodiment 1, there can be formed a projection ion beam having a higher current density. In FIG. 1, when the illumination lens 5-1 is proximate to the ion source 2 to thereby reduce Lo, the aperture 7 also becomes necessarily proximate to the ion source 2 and in accordance therewith, the possibility that back-sputtered particles or secondary electrons emitted from the aperture 7 reach a front end of the ion source 2 is also increased. This effects enormous adverse influence on ion emission stability and the lift of the ion source 2. Therefore, a lower limit of the distance between the ion source 2 and the aperture 7 is about 5 mm and a lower limit of Lo is about 15 mm. Hence, according to the embodiment, as shown by FIG. 6, the illumination lens 5-1 is constituted by an acceleration lens having two electrodes and an Einzel lens having three electrodes and the aperture 7 is arranged between these lenses. Further, the aperture 7 is connected to a constant voltage circuit 70 to thereby bias it to about 50 V and prevent emission of secondary electrons. Thereby, according to the embodiment, the distance Lo between the ion source 2 and the illumination lens 5-1 can be shortened to about 12 mm and further, the distance between the ion source 2 and the aperture 7 can be increased to 10 mm.

As described above, the projection ion beam machining apparatus according to the present invention is useful for applications in which a region having a size equal to or smaller than several 10 $\mu$m is machined with an accuracy of sub $\mu$m at high speed and is particularly suitable for applications in which high accuracy is particularly required at a side of a portion of a machining region, as in observation of a section of a semiconductor or the like.

Further, the projection ion beam machining apparatus according to the present invention is applicable also to a machining operation, the reduction to practice of which has been difficult due to the problem of throughput in the conventional focused ion beam machining apparatus.

What is claimed is:

1. A projection ion beam machining apparatus comprising:
   an ion source,
   a sample stage for holding a sample to be machined,
   a stencil mask including an opening through which an ion beam from the ion source passes,
   an illumination lens arranged between the ion source and the stencil mask,
   a projection lens arranged between the stencil mask and the sample stage,
   a power source connected to the illumination lens, and
   means for controlling the illumination lens, wherein said means for controlling the illumination lens controls a voltage of the power source to minimize a diameter of the ion beam at a center of the projection lens.

2. The projection ion beam machining apparatus according to claim 1, wherein said illumination lens and said projection lens each comprise electrostatic deflecting means.

3. The projection ion beam machining apparatus according to claim 1, wherein said illumination lens comprises an Einzel lens.

4. The projection ion beam machining apparatus according to claim 1, further comprising:
   an blanking deflector arranged on a side of the ion source of the projection lens for blanking an ion beam, and
   a fixed aperture arranged on a side of the sample stage of the blanking deflector.

5. The projection ion beam machining apparatus according to claim 1, further comprising:
   a plurality of selectable operable openings in the stencil mask,
   said means for controlling the illumination lens comprising:
      means for storing two or more sets of control parameters, and
      means for changing the sets of the control parameters in association with a change of the openings of the mask.

6. The projection ion beam machining apparatus according to claim 1, wherein a value of (L/Lo)(L/Li) is equal to or larger than 400, where
   the Lo is defined as a distance from a substantial center of the illumination lens most proximate to the ion source and an ion emitting portion of the ion source,
   the Li is defined as a distance between a substantial center of the projection lens most proximate to the sample and a surface of the sample,
   L is defined as a distance between the substantial centers of the illumination lens and the projection lens.

7. A projection ion beam machining apparatus comprising:
   an ion source,
   a stage to hold a sample,
   a mask having an opening to pass an ion beam;
   an illumination lens arranged between the ion source and the mask,
   a projection lens arranged between the mask and the stage,
   a power source coupled to the illumination lens, and
   means for controlling the illumination lens and controlling a voltage of the power source so as to minimize a diameter of the ion beam at a center of the projection lens.

8. The projection ion beam machining apparatus according to claim 7, wherein said illumination lens and said projection lens each comprise electrostatic deflecting means.

9. The projection ion beam machining apparatus according to claim 7, wherein said illumination lens comprises an Einzel lens.

10. The projection ion beam machining apparatus according to claim 7, further comprising:
    a blanking deflector arranged on a side of the ion source of the projection lens to blank an ion beam; and
    a fixed aperture arranged on a side of the stage of the blanking deflector.

11. The projection ion beam machining apparatus according to claim 7, further comprising:
    a plurality of selectable openings in the mask,
    said means for controlling the illumination lens comprising:
       means for storing a plurality of sets of control parameters, and
       means for changing the control parameters in association with a change of said openings.

12. The projection ion beam machining apparatus according to claim 7, wherein a value of (L/Lo)(L/Li) is equal to or larger than 400, where,
    the Lo is a distance from a substantial center of the illumination lens most proximate to the ion source and an ion emitting portion of the ion source,
    the Li is a distance between a substantial center of the projection lens most proximate to the sample and a surface of the sample,
    L is a distance between the substantial centers of the illumination lens and the projection lens.

* * * * *